(12) United States Patent
Tada et al.

(10) Patent No.: US 7,691,728 B2
(45) Date of Patent: Apr. 6, 2010

(54) SEMICONDUCTOR DEVICE AND METHOD FOR MANUFACTURING THE SAME

(75) Inventors: Yasuhiro Tada, Kanagawa-ken (JP); Akihiko Hanya, Kanagawa-ken (JP)

(73) Assignee: Stanley Electric Co., Ltd., Tokyo (JP)

( * ) Notice: Subject to any disclaimer, the term of this patent is extended or adjusted under 35 U.S.C. 154(b) by 133 days.

(21) Appl. No.: 11/677,097

(22) Filed: Feb. 21, 2007

(65) Prior Publication Data

US 2007/0262329 A1 Nov. 15, 2007

(30) Foreign Application Priority Data

May 12, 2006 (JP) .............................. 2006-133443

(51) Int. Cl.
*H01L 21/20* (2006.01)
(52) U.S. Cl. .................... 438/478; 438/33; 438/34; 438/35; 438/36; 438/68; 438/69; 438/70; 438/71; 438/72; 438/113; 438/114; 438/115; 438/116
(58) Field of Classification Search ............. 438/478
See application file for complete search history.

(56) References Cited

U.S. PATENT DOCUMENTS

| | | | | |
|---|---|---|---|---|
| 5,418,190 A | * | 5/1995 | Cholewa et al. ............ 438/33 |
| 5,429,954 A | * | 7/1995 | Gerner ...................... 438/33 |
| 5,643,803 A | * | 7/1997 | Fukada et al. .............. 438/50 |
| 5,729,897 A | * | 3/1998 | Schmidt et al. ............. 29/852 |
| 5,827,755 A | * | 10/1998 | Yonehara et al. ........... 438/30 |
| 5,827,756 A | * | 10/1998 | Sugino et al. .............. 438/50 |
| 5,831,510 A | * | 11/1998 | Zhang et al. ............ 338/22 R |
| 5,949,118 A | * | 9/1999 | Sakai et al. .............. 257/419 |
| 6,048,748 A | * | 4/2000 | Khare et al. .............. 438/39 |
| 6,165,860 A | * | 12/2000 | Watanabe ................. 438/313 |
| 6,192,581 B1 | * | 2/2001 | Tsukamoto ............... 29/852 |
| 6,392,528 B1 | * | 5/2002 | Myong .................. 338/22 R |
| 6,684,699 B1 | * | 2/2004 | Lapadatu et al. .......... 73/514.29 |
| 6,838,972 B1 | * | 1/2005 | Minervini et al. ......... 338/22 R |
| 7,132,321 B2 | * | 11/2006 | Kub et al. ................ 438/172 |
| 7,367,114 B2 | * | 5/2008 | Rybka et al. .............. 29/623 |
| 7,368,756 B2 | * | 5/2008 | Bruhns et al. .............. 257/93 |
| 7,391,068 B2 | * | 6/2008 | Kito et al. ................ 257/288 |

(Continued)

FOREIGN PATENT DOCUMENTS

JP 6326365 11/1994

*Primary Examiner*—Fernando L Toledo
*Assistant Examiner*—Ankush k Singal
(74) *Attorney, Agent, or Firm*—Cermak Kenealy Vaidya & Nakajima LLP

(57) ABSTRACT

A semiconductor device manufacturing method can produce semiconductor light emitting/detecting devices that have high connective strength and high luminous energy by increasing contact areas of electrodes thereof and decreasing enclosed areas of electrodes thereof. A wafer is provided with a semiconductor substrate and a semiconductor epitaxial layer. A plurality of substrate concave portions and epitaxial layer concave portions are formed on the semiconductor substrate and the semiconductor epitaxial layer, respectively. Substrate electrodes and epitaxial layer electrodes are formed in the substrate concave portions and the epitaxial layer concave portions. A substrate surface electrode and an epitaxial layer surface electrode can be formed on the semiconductor substrate and the substrate electrodes and the semiconductor epitaxial layer and the epitaxial layer electrodes, respectively. The wafer can be diced at a location that includes both the substrate electrodes and the epitaxial layer electrodes, and can then be separated to provide the device(s).

12 Claims, 3 Drawing Sheets

U.S. PATENT DOCUMENTS

| | | | |
|---|---|---|---|
| 7,397,128 B2 * | 7/2008 | Kubo et al. | 257/774 |
| 7,435,628 B1 * | 10/2008 | Hopper et al. | 438/138 |
| 2002/0117743 A1 * | 8/2002 | Nakatani et al. | 257/687 |
| 2005/0156283 A1 * | 7/2005 | Tokuda et al. | 257/622 |
| 2005/0218443 A1 * | 10/2005 | Tamura et al. | 257/310 |
| 2006/0151773 A1 * | 7/2006 | Kai et al. | 257/9 |
| 2006/0220214 A1 * | 10/2006 | Ando | 257/690 |
| 2007/0215938 A1 * | 9/2007 | Yanagida et al. | 257/330 |
| 2008/0042150 A1 * | 2/2008 | Yamaguchi | 257/88 |

* cited by examiner

SEMICONDUCTOR DEVICE AND METHOD FOR MANUFACTURING THE SAME

This application claims the priority benefit under 35 U.S.C. §119 of Japanese Patent Application No. 2006-133443 filed on May 12, 2006, which is hereby incorporated in its entirety by reference.

BACKGROUND

1. Field

The presently disclosed subject matter relates to a manufacturing method of semiconductor light emitting/detecting devices including LEDs, laser diodes, photodiodes, phototransistors, etc. and to the devices themselves. More specifically, the subject matter relates to the manufacturing method of semiconductor light emitting/detecting devices that include a structure that provides secure mounting on conductor patterns, and to the associated devices themselves.

2. Description of the Related Art

FIG. 6 shows a conventional LED device 90 that is a surface mount chip type by way of example of typical semiconductor light emitting devices. The LED device includes a light emitting layer of p-n junction formed between p-type layer 91 and n-type layer 92. An electrode portion 93 is formed on the p-type layer and an electrode portion 94 is formed on the n-type layer.

The conventional LED device is provided with solder coating layer 95$p$, 95$n$ on the respective electrode portions 93, 94. A resin coating layer is formed on a surrounding surface except for the electrode portions in order to provide damp proofing measures.

When the conventional semiconductor light emitting device based upon the above structure is mounted on a circuit board, the conventional device is placed on a pair of conductor patterns 81$p$ and 81$n$ that are formed on a circuit board 80. The conventional device is fixed with an adhesive 82 between the bottom surface thereof and the circuit board, if necessary. The circuit board in such state is passed through a reflow furnace, etc., and is heated to a temperature that is more than a melting temperature of solder.

In the above process, the solders of solder coating layers 95$p$, 95$n$ on the respective electrode portions 93, 94, are melted, caused to flow down, and are diffused on the conductor patterns 81$p$ and 81$n$ of the circuit board, as shown in FIG. 7. The solders are solidified in a normal or ambient temperature after the circuit board has passed through the reflow furnace. Thus, the conventional LED device is electrically connected and is mechanically fixed between the electrode portion 93 and the conductor pattern 81$p$, and between the electrode portion 94 and the conductor pattern 81$n$. The exemplary conventional LED device of surface mount chip type can be electrically connected and mechanically fixed as described in further detail, for example, in Japanese Patent No. 3,022,049 (corresponding to Japanese Patent Application No. JP-6-326365 A) and its English translation, which are hereby incorporated in their entirety by reference.

In the conventional semiconductor light emitting device of surface mount chip type described above, electrical and physical contact occurs only between a thickness portion of the electrode portions 93 (94) and the conductor patterns 81$p$ (81$n$). The connective strength between the conventional device and the circuit board mainly depends on the solder portions 95$p$ (95$n$) that cover a portion of the electrode portions 93 (94) and the conductor patterns 81$p$ (81$n$), so that the contact area between the bottom thickness portions of the electrode portion 93 (94) and the conductor patterns 81$p$ (81$n$) is very narrow and small.

Thus, a big difference in connective strengths for conventional devices can easily be caused by several variables, including temperature of the reflow furnace, thickness of the solder coated on the electrode portions 93 (94), soldering compatibility with the conductor pattern 81$p$ (81$n$), and other conditions. Recently, in equipment that is required to resist extreme vibration and impact, such as vehicles, ships, aircraft, etc., the use of LED devices has increased with the goal/purpose of improving reliability, efficiency, etc. Under these circumstances, the use of the conventional surface mount chip type semiconductor light emitting devices has various problems, and big differences in the connective strength may be caused by different conditions at the time of production as described above.

Luminous energy of the semiconductor light emitting device can be influenced by the amount of open surface and the number of the chips being used. The conventional LED device 90 has another problem in that the device is completely closed by the two surfaces of the electrode portions 93, 94 making the device 90 appear darker than a "dome shaped" LED device in which the same chip thereof is mounted on one lead frame via die bonding, for example.

The disclosed subject matter has been devised to consider the above and other problems and characteristics. Thus, an embodiment of the disclosed subject matter can include manufacturing methods and associated semiconductor light emitting/detecting devices that do not cause the above-described various problems related to differences in the connective strength caused during production, and to reduce or change other associated problems and characteristics of the conventional methods and devices.

SUMMARY OF THE DISCLOSED SUBJECT MATTER

The presently disclosed subject matter has been devised in view of the above and other problems and to make certain changes to the existing manufacturing methods. Another aspect of the disclosed subject matter includes methods of manufacture that provide various semiconductor light emitting/detecting devices with high reliability and high luminous energy, and their associated devices.

According to another aspect of the disclosed subject matter, a method for manufacturing semiconductor light emitting/detecting devices can include: providing a wafer with a semiconductor substrate and a semiconductor epitaxial layer including a semiconductor light emitting/detecting layer grown in parallel on the semiconductor substrate; providing a plurality of substrate concave portions on the semiconductor substrate and a plurality of epitaxial layer concave portions on the semiconductor epitaxial layer in a position substantially opposite the substrate concave portions, forming substrate electrodes in the substrate concave portions and epitaxial layer electrodes in the epitaxial layer concave portions, a substrate surface electrode on the semiconductor substrate and the substrate electrodes, and an epitaxial layer surface electrode on the semiconductor epitaxial layer and the epitaxial layer electrodes; dicing the wafer, the substrate surface electrode, the substrate electrode, the epitaxial layer electrode, and the epitaxial layer surface electrode between the substrate electrodes and the epitaxial layer electrodes; and separating the wafer to provide at least one device. The above method for manufacturing semiconductor light emitting/detecting devices can provide a surface mount chip type semiconductor light emitting/detecting device that is able to be mounted on the conductor patterns with strength and confidence.

Another of the aspects of the disclosed subject matter includes a method for manufacturing semiconductor light emitting/detecting devices that can include: providing a wafer with a semiconductor substrate and a semiconductor epitaxial layer including a semiconductor light emitting/detecting layer grown in parallel on the semiconductor substrate; providing a plurality of substrate concave portions on the semiconductor substrate and a plurality of epitaxial layer concave portions on the semiconductor epitaxial layer in a position substantially opposite the substrate concave portions, forming substrate electrodes in the substrate concave portions and epitaxial layer electrodes in the epitaxial layer concave portions, a substrate surface electrode on the semiconductor substrate and the substrate electrodes, and an epitaxial layer surface electrode on the semiconductor epitaxial layer and the epitaxial layer electrodes; dicing the wafer, the substrate surface electrode, the substrate electrode, the epitaxial layer electrode and the epitaxial layer surface electrode between the substrate electrodes and the epitaxial layer electrodes, and between the substrate surface electrode without the substrate electrodes and the epitaxial layer surface electrode without the epitaxial layer electrodes; and separating the wafer to provide at least one device. The above method for manufacturing semiconductor light emitting/detecting devices can provide surface mount chip type semiconductor light emitting/detecting devices that can be mounted on the conductor patterns with strength and confidence and that have increased luminous energy.

In the above described exemplary methods for manufacturing semiconductor light emitting/detecting devices, at least one step for forming the substrate electrodes in the substrate concave portions and the epitaxial layer electrodes in the epitaxial layer concave portions can be excluded. The above methods for manufacturing semiconductor light emitting/detecting devices can provide a method that does not require use of a mask, as will be described later.

In the above described exemplary methods for manufacturing semiconductor light emitting/detecting devices, at least one surface electrode of the substrate surface electrode and the epitaxial layer surface electrode may not be formed on each dicing area of the semiconductor substrate without the substrate concave portions and the semiconductor epitaxial layer without the epitaxial layer concave portions. The above method for manufacturing semiconductor light emitting/detecting devices can provide a device that can be confidently and strongly mounted on conductor patterns and can have high luminous energy.

Another of the aspects of the disclosed subject matter includes a semiconductor light emitting/detecting device in which a semiconductor light emitting/detecting layer thereof is mounted perpendicularly to a mounting surface that can include: a wafer having a semiconductor substrate and a semiconductor epitaxial layer including the semiconductor light emitting/detecting layer grown in parallel on the semiconductor substrate; a substrate electrode portion forming on at least a portion of bottom surface, side surface and upper surface of the semiconductor substrate; and an epitaxial layer electrode portion forming on at least a portion of bottom surface, side surface and upper surface of the semiconductor epitaxial layer. The above semiconductor light emitting/detecting device may be a surface mount chip type that is able to be confidently and strongly mounted on the conductor patterns.

In the above described exemplary devices, the substrate electrode portion and the epitaxial layer electrode portion are not formed on at least a portion of the side surface and the upper surface. The above semiconductor light emitting/detecting device may be a surface mount chip type that is able to be confidently and strongly mounted on conductor patterns and which have high luminous energy.

BRIEF DESCRIPTION OF THE DRAWINGS

These and other characteristics and features of the disclosed subject matter will become clear from the following description with reference to the accompanying drawings, wherein.

DETAILED DESCRIPTION OF EXEMPLARY EMBODIMENTS

Figure 1:
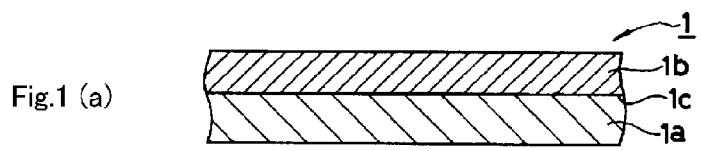
FIGS. 1(a)-(h) are side cross-section views showing respective processes of an exemplary method for manufacturing semiconductor light emitting/detecting devices in accordance with an exemplary embodiment of the disclosed subject matter.
Figure 1:
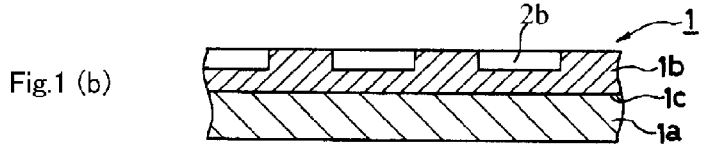
Figure 1:
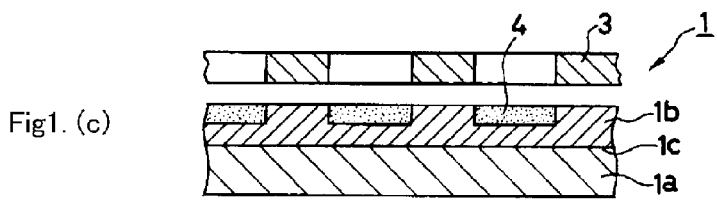
Figure 1:
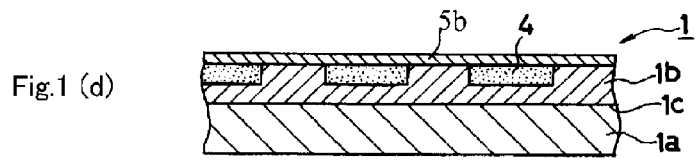
Figure 1:
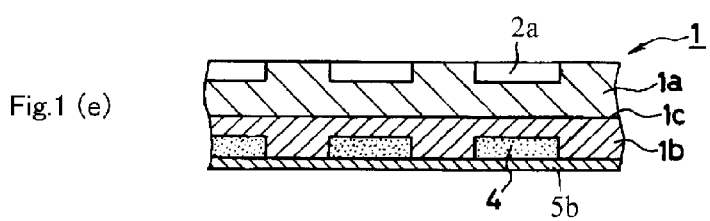
Figure 1:
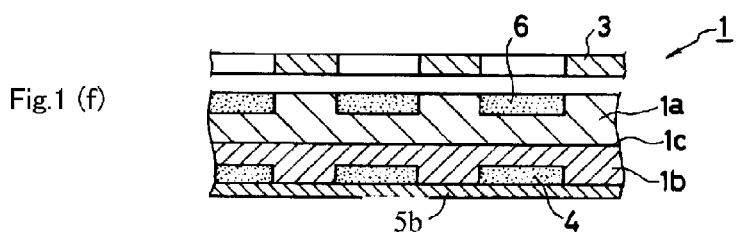
Figure 1:
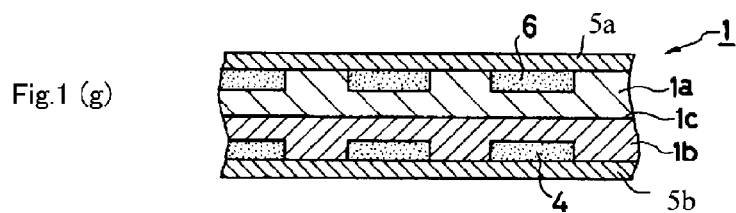
Figure 1:
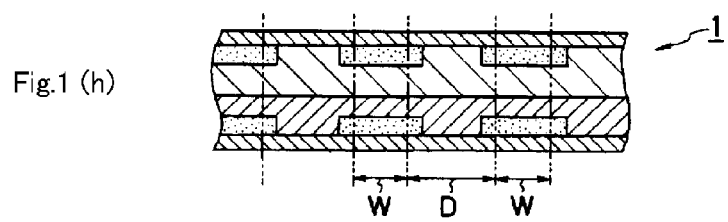
Figure 2:
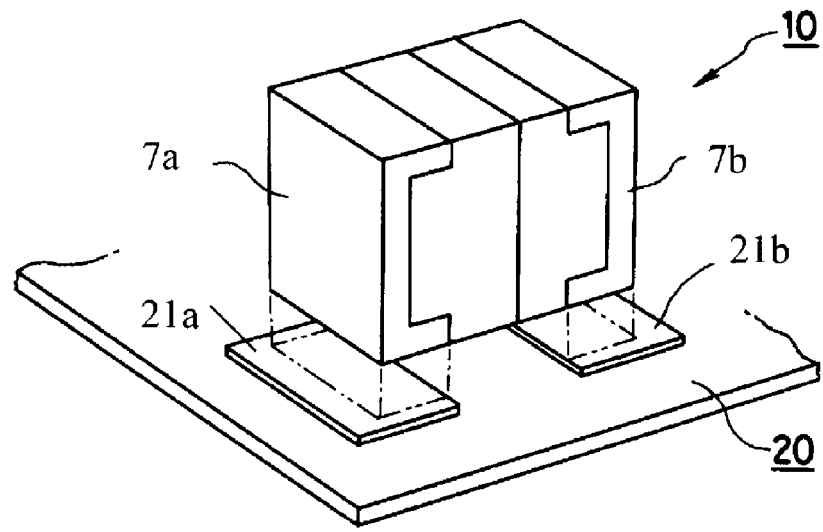
FIG. 2 is a perspective view showing a device produced by the method for manufacturing semiconductor light emitting/detecting devices shown in FIG. 1.
Figure 3:
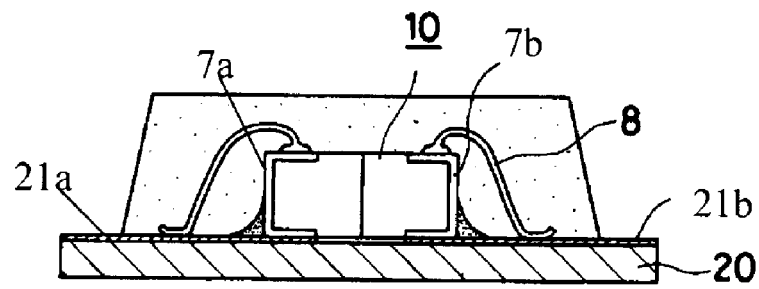
FIG. 3 is a side cross-section view showing an exemplary finalized device produced by the method for manufacturing semiconductor light emitting/detecting devices shown in FIG. 1.

An exemplary embodiment of the disclosed subject matter will now be described in detail with reference to FIGS. 1(a)-(h), FIG. 2 and FIG. 3. FIG. 2 shows a device produced by the above manufacturing method shown in FIG. 1, and FIG. 3 shows an exemplary finalized device produced by the above manufacturing method shown in FIG. 1.

The process shown in FIGS. 1(a)-(h) is an exemplary method for manufacturing a semiconductor light emitting device 10 shown in FIG. 2. The process shown in FIG. 1(a) can include preparing a wafer 1 having a semiconductor substrate 1a, and a semiconductor epitaxial layer 1b grown in parallel on the semiconductor substrate 1a. The semiconductor epitaxial layer 1b can includes p-type layer, n-type layer, a light emitting layer 1c of p-n junction formed between the p-type layer and the n-type layer, and an outermost layer such as a current spreading layer that is formed thicker than the light emitting layer 1c on the opposite side of the semiconductor substrate 1a.

The process shown in FIG. 1(b) can include providing a plurality of epitaxial layer concave portions 2b formed from the outermost side of the semiconductor epitaxial layer 1b by well-known means such as dicing, laser cutting, etching etc. A depth of the epitaxial layer concave portions 2b can be set in a range that does not effect the function of the semiconductor light emitting chip so as to break the light emitting layer 1c of p-n junction, for instance, in the range of the current spreading layer.

The process shown in FIG. 1(c) can include forming epitaxial layer electrodes 4 made of Au or the like in the epitaxial layer concave portions 2b using a mask 3. A thickness of the epitaxial layer electrodes 4 can be the same thickness as the epitaxial layer concave portions 2b, that is, the height of the epitaxial layer electrodes 4 can be such that a top surface of the electrode 4 is at substantially the same height as a top surface of the semiconductor epitaxial layer 1b.

The process shown in FIG. 1(d) can include forming an epitaxial layer surface electrode 5b that can be formed from Au, etc., on both the semiconductor epitaxial layer 1b and the epitaxial layer electrodes 4 by means such as deposition, etc. Alternatively, this process can be carried out in a state excluding the above process of forming the epitaxial layer electrodes 4 in the epitaxial layer concave portions 2b. The action and the effect will be described in paragraph [0037] below.

The process shown in FIG. 1(e) can include providing a plurality of substrate concave portions 2a on the semiconductor substrate 1a that are configured similar to or the same as the epitaxial layer concave portions 2b. The substrate concave portions 2a are formed on the corresponding substrate layer 1a that is opposite epitaxial layer concave portions 2b, thus the semiconductor light emitting layer 1c is located between the substrate concave portions 2a and the epitaxial layer concave portions 2b.

The process shown in FIG. 1(f) can include forming substrate electrodes 6 made of Au or the like in the substrate concave portions 2a using the mask 3. The thickness of the substrate electrodes 6 can be the same or similar to the substrate concave portions 2a, that is, the height at which a top surface of the substrate electrodes 6 is located can be substantially the same as the height of a top surface of the semiconductor substrate 1a.

The process shown in FIG. 1(g) can include forming a substrate surface electrode 5a made of Au, etc., on both the semiconductor substrate 1a and the substrate electrodes 6 by means such as deposition, etc. Alternatively, this process can be carried out in a state excluding the above process of forming the substrate electrodes 6 in the substrate concave portions 2a shown in FIG. 1(f) (similar to the process involving the epitaxial layer electrodes 4).

Thus, the wafer 1 can be provided with epitaxial layer electrodes 4 located in the semiconductor epitaxial layer 1b, and substrate electrodes 6 located in the semiconductor substrate 1a and opposite the epitaxial layer electrodes 4. The epitaxial surface electrode 5b can be located adjacent or on both the epitaxial layer electrodes 4 and the semiconductor epitaxial layer 1b, and the substrate surface electrode 5a can be located adjacent or on both the substrate electrodes 6 and the semiconductor substrate 1a.

The process shown in FIG. 1(h) can include dicing the wafer 1 from the top of the substrate surface electrode 5a through the epitaxial surface electrode 5b via the substrate electrodes 6, the epitaxial layer electrodes 4. The wafer can then be separated to provide at least one device. The width W cut by a dicing blade and the height D of the wafer separated by dicing are shown in FIG. 1(h).

FIG. 2 shows an exemplary semiconductor light emitting device 10 produced through the above process shown in FIGS. 1(a)-(h). The semiconductor light emitting device 10 includes a substrate electrode portion 7a and an epitaxial layer electrode portion 7b formed on the respective bottom surface, side surface and upper surface.

As described above, at least the process for forming the epitaxial layer electrodes 4 shown in FIG. 1(c) and the substrate electrodes 6 shown in FIG. 1(f) can be excluded before forming the epitaxial layer surface electrode 5b and the substrate surface electrode 5a, respectively. The separate process shown in FIG. 1(c) can be eliminated because the epitaxial layer electrodes 4 and the epitaxial layer surface electrode 5b can be simultaneously formed on both the epitaxial layer concave portions 2b and the semiconductor epitaxial layer 1b during the process for forming the epitaxial layer surface electrode 5b as shown in FIG. 1(d). In addition, the substrate electrodes 6 and the substrate surface electrode 5a can be simultaneously formed on both the substrate concave portions 2a and the substrate surface electrode 5a during the process for forming the substrate surface electrode 5a as shown in FIG. 1(g). The exclusion of the above processes can result in shortening a lead time for production and can eliminate the need for the mask 3. However, in the mask exclusion type process for forming the epitaxial layer surface electrode 5b shown in FIG. 1(d) and the substrate surface electrode 5a shown in FIG. 1(g), the epitaxial layer electrodes 4 and the substrate electrodes 6 can be formed thicker at the epitaxial layer concave portion 2b and the substrate concave portion 2a, respectively, than in the case in which the processes of FIG. 1 (c) and FIG. 1(f) are included. Therefore, the resulting product may have wider electrodes at the bottom surface and upper surface for the substrate electrode portion 7a and the epitaxial layer electrode portion 7b. In addition, both the substrate surface electrode and the epitaxial layer surface electrode can be formed thicker in order to maintain wide electrodes at the bottom and upper surfaces 7a and 7b. Thus, it is possible to select whether the above process is or should be included or excluded according to the type of device or its usage.

The above exemplary embodiment refers to: providing the epitaxial layer concave portions 2b on the semiconductor epitaxial layer 1b shown in FIG. 1(b); forming the epitaxial layer electrodes 4 in the epitaxial layer concave portions 2b shown in FIG. 1(c); forming the epitaxial layer surface electrode 5b shown in FIG. 1(d); providing the substrate concave portions 2a on the semiconductor substrate 1a shown in FIG. 1(e); forming the substrate electrodes 6 in the substrate concave portions 2a shown in FIG. 1(f); and forming the substrate surface electrode 5a shown in FIG. 1(g). The manufacturing method can be carried out through variations in the order of the processes, for example, the processes shown in FIG. 1(e)-(g) can be accomplished first and then followed by the processes shown in FIG. 1(b)-(d), etc.

Similarly, the manufacturing method can be also carried out through the interposition of the processes shown in FIG. 1(b) and FIG. 1(e), the processes shown in FIG. 1(c) or FIG. 1(f) and the processes shown in FIG. 1(d) and FIG. 1(g), and through the interposition of the processes shown in FIG. 1(b) or FIG. 1(e) with the processes shown in FIGS. 1(c)-(d) or the processes shown in FIG. 1(f)-(g). In other words, the process can be carried out in various orders.

Further more, the above exemplary embodiment refers to dicing the wafer 1 from the top of the substrate surface electrode 5a through to the epitaxial surface electrode 5b via both the substrate electrodes 6 and the epitaxial layer electrodes 4, and separating the wafer 1 to provide at least one device, as shown in FIG. 1(h). However, the manufacturing method can include dicing the wafer 1 from the end or outer surface of the epitaxial surface electrode 5b to the top of the substrate surface electrode 5b via the epitaxial layer electrodes 4 and the substrate electrodes 6, and separating the wafer 1 to provide at least one device.

FIG. 2 is perspective view showing an exemplary semiconductor light emitting device 10 produced by the manufacturing method as shown in FIG. 1. The semiconductor light emitting device 10 is provided with a substrate electrode portion 7a that has a substantially "["-shaped structure, and is composed of the substrate surface electrode 5a and the substrate electrodes 6. The epitaxial layer electrode portion 7b has a substantially "]"-shaped structure, and is composed of the epitaxial layer surface electrode 5b and the epitaxial layer electrodes 4. When the semiconductor light emitting device 10 is mounted on a substrate conductor pad 21a and an epitaxial layer conductor pad 21b formed on a circuit board 20, the substrate electrode portion 7a and the epitaxial layer electrode portion 7b are respectively mounted on the substrate conductor pad 21a and the epitaxial layer conductor pad 21b through solder portions.

Thus, the connective strength through the solder portions can be relatively high because the semiconductor light emitting device 10 has both the substrate electrode portion 7a and the epitaxial layer electrode portion 7b located on the substrate conductor pad 21a and the epitaxial layer conductor pad 21b, respectively. The above structure is an exemplary structure of the disclosed subject matter. Depending on usage and purpose, etc., of the semiconductor light emitting device 10, the shape of the substrate electrode portion 7a and the epitaxial layer electrode portion 7b can be variously and differently formed by the manufacturing method of the disclosed subject matter.

Figure 7:
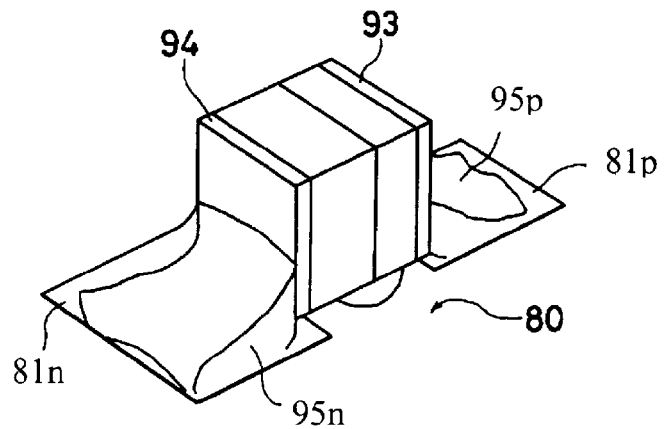
FIG. 7 is perspective view depicting a mounted state for the device shown in FIG. 6 on a circuit board.

For example, the semiconductor light emitting device 10 produced by the above manufacturing method can be used for equipment that is required to resist extreme vibration and impact such as a vehicle, a ship, an aircraft, etc. Because the device 10 can be electrically mounted on the substrate conductor pad 21a and the epitaxial layer conductor pad 21b, and also can be electrically connected to the pads 21a and 21b via wire bonding as shown in FIG. 3, the reliability of the device 10 can be greater than that of the conventional light emitting device 90 as shown in FIG. 7, for example.

As described above, the luminous energy emitted from the light emitting layer 1c that includes the p-n junction can be partly lost due to the position and extent of the substrate electrode portion 7a and the epitaxial layer electrode portion 7b. Thus, the luminous energy emitted out of the device 10 can be increased by decreasing the area of the substrate electrode portion 7a and the epitaxial layer electrode portion 7b to be as small as possible.

Figure 4:
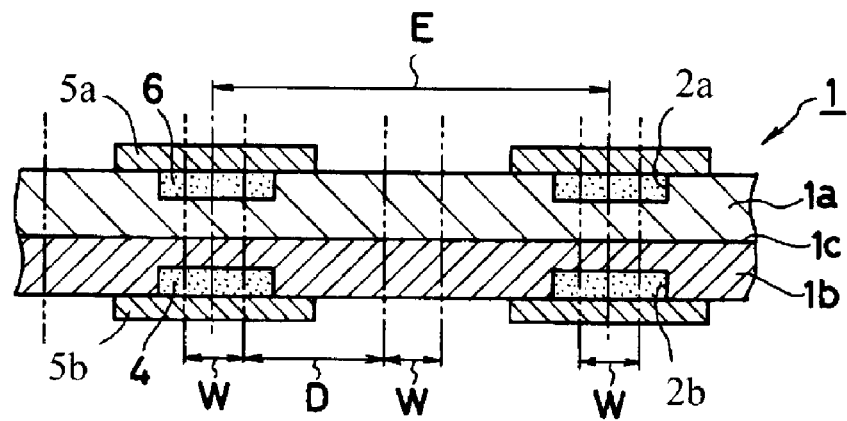
FIG. 4 is side cross-section view depicting portions of a dicing process corresponding to FIG. 1(h) but in accordance with another exemplary embodiment of the disclosed subject matter.

Another exemplary embodiment of the disclosed subject matter will now be described with respect to FIG. 4. FIG. 4 shows parts of processes corresponding to the process of FIG. 1(h). Differences between the embodiment of FIG. 4 and the embodiment of FIG. 1 include an interval E between the concave portions 2a (2b) in the embodiment of FIG. 4 that is approximately double that in the embodiment of FIG. 1, and a width of the substrate surface electrode 5a and the epitaxial surface electrode 5b in the embodiment of FIG. 4 that is approximately a quarter of that in the embodiment of FIG. 1. That is, the substrate surface electrode 5a and the epitaxial surface electrode 5b in the embodiment of FIG. 4 can be respectively formed on the substrate concave portion 2a and a part of the adjacent semiconductor substrate 1a, and on the epitaxial layer concave portion 2b and a part of the adjacent semiconductor epitaxial layer 1b by means of masking etc. The other processes for making the device can be the similar or the same. The dicing process for the separation can also be carried out at the width portion W as in the embodiment of FIG. 1.

Figure 5:
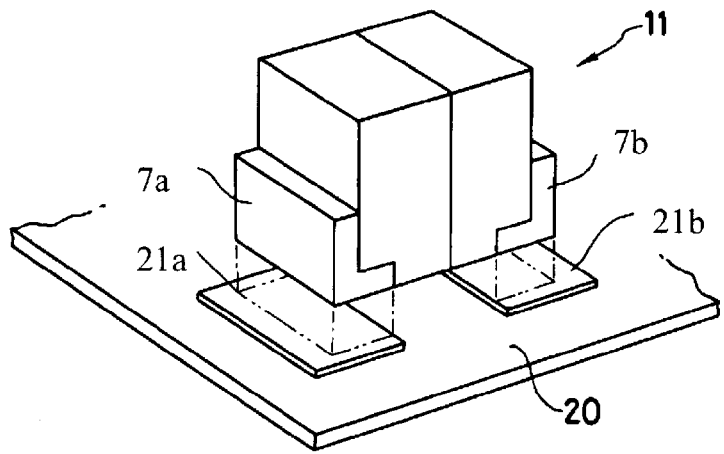
FIG. 5 is perspective view showing a device produced by the method for manufacturing semiconductor light emitting/detecting devices shown in FIG. 4.
Figure 6:
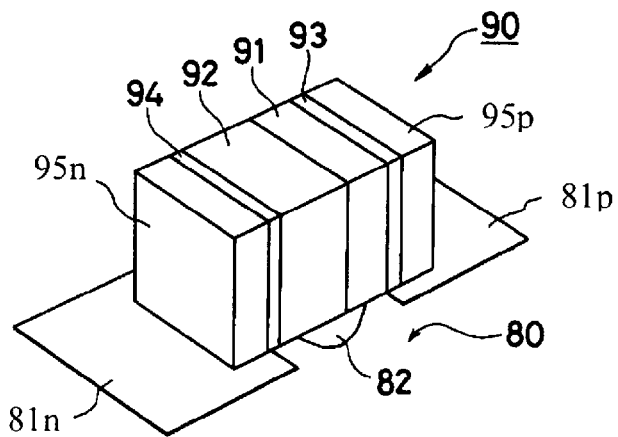
FIG. 6 is perspective view showing an exemplary conventional surface mount chip type LED device.

The embodiment of the semiconductor light emitting device 11 shown in FIG. 5 can include electrode portions 7a and 7b that are substantially L-shaped when mounted on the circuit board 20. The approximate upper half portion of the substrate electrode portion 7a and the epitaxial layer electrode portion 7b of FIG. 4 are removed as shown in FIG. 5. The device 11 can be provided with the substantially L-shaped substrate electrode portion 7a and the substantially L-shaped epitaxial layer electrode portion 7b to mount on the substrate conductor pad 21a and on the epitaxial layer conductor pad 21 of the circuit board 20 by dicing the wafer 1 from the substrate electrodes 6 through to the epitaxial layer electrodes 4 at a location where the semiconductor substrate 1a does not include the substrate surface electrodes 5a and where the semiconductor epitaxial layer 1b does not include the epitaxial layer surface electrodes 5b. The wafer 1 can then be separated. Thus, the luminous energy of the device 11 can be increased by decreasing the area closed by the substrate electrode portion 7a and the epitaxial layer electrode portion 7b.

When the substrate surface electrode 5a and the epitaxial layer surface electrode 5b are formed on an entire surface without the mask used in the embodiment of FIG. 4, the semiconductor light emitting device 11 can be cubic with the substrate electrode portion 7a and the epitaxial layer electrode portion 7b formed only on their respective bottom and side surfaces and not formed on their respective upper surfaces.

The shape of the substrate surface electrode 5a and the epitaxial layer surface electrode 5b should not be limited by the shape of the mask. Furthermore, the shape of the substrate concave portion 2a and the epitaxial layer concave portion 2b should also not be limited by the shape of a mask such as the mask 3. For example, when the device 10 or 11 is mounted on the circuit board, it is possible to construct the substrate electrode portion 7a and the epitaxial layer electrode 7b in various shapes so as to avoid mounting errors or gaps, and to achieve a flush mount to variously shaped surfaces.

In the above-described embodiments, the semiconductor light emitting devices 10 and 11 which are used as light emitting devices are mounted on the circuit board 20. However, it is possible to mount photodiode chips, phototransistor chips, etc., that can be used as light detecting devices. In addition other light emitting devices such as laser diodes, etc., and other types of semiconductor chips in general can be used in place of the LED chips 10, 11 described above for use as the electrical component without departing from the spirit and scope of the presently disclosed subject matter.

Another exemplary embodiment of the disclosed subject matter relates to a semiconductor light emitting device produced by the manufacturing method of the above described embodiments. The disclosed subject matter includes a semiconductor light emitting device in which a semiconductor light emitting layer 1c thereof is mounted perpendicularly with respect to a mounting surface, the device can include: a wafer 1 having a semiconductor substrate 1a and a semiconductor epitaxial layer 1b including the semiconductor light emitting layer 1c grown in parallel on the semiconductor substrate 1a; a substrate electrode portion 7a formed on at least a portion of the bottom surface, side surface and upper surface of the semiconductor substrate 1a; and an epitaxial layer electrode portion 7b formed on at least a portion of the bottom surface, side surface and upper surface of the semiconductor epitaxial layer 1b. The above semiconductor light emitting device can be a surface mount chip type device that can be confidently and strongly mounted on the conductor patterns 21a, 21b.

In the above-described exemplary device, the substrate electrode portion 7a and the epitaxial layer electrode portion 7b are not formed on at least a portion of the side surface and the upper surface. The above semiconductor light emitting device can be a surface mount chip type device that is able to be confidently and strongly mounted on the conductor patterns 21a, 21b and can have high luminous energy.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A method for manufacturing a semiconductor device comprising:
    providing a wafer with a semiconductor substrate and a semiconductor epitaxial layer;
    providing a plurality of substrate concave portions on the semiconductor substrate and a plurality of epitaxial layer concave portions on the semiconductor epitaxial layer substantially opposite the substrate concave portions,
    forming substrate electrodes in the substrate concave portions, each of the substrate electrodes including a top surface facing away from the semiconductor epitaxial layer;
    forming epitaxial layer electrodes in the epitaxial layer concave portions, each of the epitaxial layer electrodes including a top surface facing away from the semiconductor substrate layer;
    forming a substrate surface electrode adjacent the semiconductor substrate, the substrate surface electrode being on the top surface of the substrate electrodes;
    forming an epitaxial layer surface electrode adjacent the semiconductor epitaxial layer, the epitaxial layer surface electrode being on the top surface of the epitaxial layer electrodes;
    dicing the wafer, the substrate surface electrode, at least one of the substrate electrodes, at least one of the epitaxial layer electrodes, and the epitaxial layer surface electrode along a plane containing the at least one of the substrate electrodes and the at least one of the epitaxial layer electrodes; and
    separating the wafer to provide at least one device.

2. The method for manufacturing a semiconductor device according to claim 1, further comprising at least one of the following:
    forming the substrate electrodes in the substrate concave portions simultaneously with forming the substrate surface electrode adjacent the semiconductor substrate; and
    forming the epitaxial layer electrodes in the epitaxial layer concave portions simultaneously with forming the epitaxial layer surface electrode adjacent the semiconductor epitaxial layer.

3. The method for manufacturing a semiconductor device according to claim 1, wherein at least one surface electrode of the substrate surface electrode and the epitaxial layer surface electrode is not formed on a dicing area, the dicing area including at least one of the following:
    a portion of the semiconductor substrate that does not include the substrate concave portions; and
    a portion of the semiconductor epitaxial layer that does not include the epitaxial layer concave portions.

4. The method for manufacturing a semiconductor device according to claim 1, wherein the semiconductor device is at least one of an LED device component and an LED chip.

5. The method for manufacturing a semiconductor device according to claim 1, wherein providing a semiconductor epitaxial layer includes providing a semiconductor light emitting layer grown in parallel on the semiconductor substrate.

6. The method for manufacturing a semiconductor device according to claim 1, wherein
    forming the substrate surface electrode includes simultaneously forming the substrate surface electrode on both the semiconductor substrate and the substrate electrodes, and
    forming the epitaxial layer surface electrode includes simultaneously forming the epitaxial layer surface electrode on both the semiconductor epitaxial layer and the epitaxial layer electrodes.

7. The method for manufacturing a semiconductor device according to claim 1, wherein the device is a light emitting device.

8. The method for manufacturing a semiconductor device according to claim 1, further comprising:
    dicing the wafer along a plane spaced from and not containing both the substrate electrodes and the epitaxial layer electrodes.

9. The method for manufacturing a semiconductor device according to claim 2, wherein at least one surface electrode of the substrate surface electrode and the epitaxial layer surface electrode is not formed on a dicing area, the dicing area including at least one of the following:
    a portion of the semiconductor substrate that does not include the substrate concave portions; and
    a portion of the semiconductor epitaxial layer that does not include the epitaxial layer concave portions.

10. The method for manufacturing a semiconductor device according to claim 2, wherein the semiconductor device is at least one of an LED device component and an LED chip.

11. The method for manufacturing a semiconductor device according to claim 3, wherein the semiconductor device is at least one of an LED device component and an LED chip.

12. The method for manufacturing a semiconductor device according to claim 9, wherein the semiconductor device is at least one of an LED device component and an LED chip.

* * * * *